(12) United States Patent
Seifert

(10) Patent No.: US 6,645,572 B2
(45) Date of Patent: Nov. 11, 2003

(54) PROCESS FOR PRODUCING A CERAMIC EVAPORATION BOAT HAVING AN IMPROVED INITIAL WETTING PERFORMANCE

(75) Inventor: Martin Seifert, Kempten (DE)

(73) Assignee: Wacker-Chemie GmbH, München (DE)

( * ) Notice: Subject to any disclaimer, the term of this patent is extended or adjusted under 35 U.S.C. 154(b) by 122 days.

(21) Appl. No.: 09/946,704

(22) Filed: Sep. 5, 2001

(65) Prior Publication Data

US 2002/0054963 A1 May 9, 2002

Related U.S. Application Data

(63) Continuation-in-part of application No. 09/311,196, filed on May 12, 1999, now abandoned.

(30) Foreign Application Priority Data

May 14, 1998 (DE) .......................................... 198 21 772

(51) Int. Cl.$^7$ .............................. B05D 3/06; B05D 5/12; B05D 1/00; C23C 14/24
(52) U.S. Cl. ...................... 427/554; 427/555; 427/596; 427/557; 118/726
(58) Field of Search .............................. 427/551, 554, 427/533, 530, 596, 597, 555, 556, 557, 559, 553; 118/726

(56) References Cited

U.S. PATENT DOCUMENTS

| | | | |
|---|---|---|---|
| 2,693,521 A | | 11/1954 | Alexander |
| 2,996,412 A | | 8/1961 | Alexander |
| 3,730,507 A | * | 5/1973 | Montgomery ................ 266/32 |
| 4,029,466 A | * | 6/1977 | Ishii et al. .................. 266/275 |
| 4,446,357 A | | 5/1984 | Barshter |
| 4,457,950 A | | 7/1984 | Fujita et al. |
| 4,514,355 A | * | 4/1985 | Montgomery ............... 264/332 |
| 4,972,061 A | | 11/1990 | Duley et al. |
| 5,178,658 A | | 1/1993 | Tumminelli et al. |
| 5,182,567 A | | 1/1993 | Wilder |
| 5,459,098 A | | 10/1995 | Maya |
| 5,648,127 A | | 7/1997 | Turchan et al. |
| 5,695,828 A | | 12/1997 | Ghosh et al. |

FOREIGN PATENT DOCUMENTS

| | | |
|---|---|---|
| DE | 10 85 743 | 7/1960 |
| DE | 19 07 099 | 1/1974 |
| DE | 23 35 569 | 2/1976 |
| DE | 31 14 467 | 10/1982 |
| DE | 33 45 832 | 8/1984 |
| DE | 195 16 233 | 6/1996 |
| EP | 03 37 391 | 10/1989 |
| JP | 56 15 6761 | 12/1981 |
| JP | 40 224 2082 | 9/1990 |

OTHER PUBLICATIONS

Translation JP 2–242082 to Okamoto et al cited as abstract on PTO–1449 Sep. 26, 1990.*
Translation of DE 3114 467 A1 to Haft Oct. 1982.*
Translation of JP 56–156761A1 to Kaneko (356156761A) Dec. 1981.*
Derwent Abstract #76–17240X [10] corresponding to DE 2 535 569.
Derwent Abstract #84–166676 [27] corresponding to DE 3 345 832.
Derwent Abstract #73–28174U [20] corresponding to DE 1 907 099.
German PTO Office Action dated Oct. 21, 1998—in German only.
Derwent Abstract (C) #1996–269322 [28] corresponding to DE 19 516 233.
Derwent Abstract #1982–92883E [44] corresponding to DE 3 114 467.

* cited by examiner

*Primary Examiner*—Marianne Padgett
(74) *Attorney, Agent, or Firm*—Collard & Roe, P.C.

(57) ABSTRACT

A ceramic evaporation boat for the evaporation of metal comprising an electrically conductive component and an electrically non conductive component, wherein the electrically conductive component of the ceramic material is concentrated at the surface of the evaporation boat from which the evaporation of the metal occurs. The evaporation boats have an improved initial wetting performance.

18 Claims, No Drawings

PROCESS FOR PRODUCING A CERAMIC EVAPORATION BOAT HAVING AN IMPROVED INITIAL WETTING PERFORMANCE

CROSS REFERENCE TO RELATED APPLICATIONS

This Application is a Continuation in Part Application of U.S. patent application Ser. No. 09/311,196 filed on May 12, 1999 and now abandon incorporated herein by reference which is based upon German Patent Application 198 21 772.2 filed on May 14, 1998.

BACKGROUND OF THE INVENTION

1. Field of the Invention

The invention relates to a process for producing a ceramic evaporation boats that have an improved initial wetting performance.

2. Description of the Prior Art

The most widely used method of coating flexible substrates with metals, in particular with aluminum is high vacuum tape coating. The substrate to be coated is passed over a cooled roller while being exposed to aluminum vapor which deposits on the substrate surface as a thin metal layer.

To generate the constant vapor stream required, ceramic evaporators known as evaporation boats, are heated to about 1450° C. by a direct passage of electric current through the evaporation boat. Aluminum wire is continuously fed to the boat, liquified on the ceramic surface and evaporated in a vacuum of about 10–4 mbar. In metallization units, a series of evaporation boats are arranged in such a away that a uniformly thick aluminum layer is deposited across the entire width of the substrate.

Evaporation boats are generally made of hot-pressed titanium diboride ($TiB_2$) and boron nitride (BN) and/or aluminum nitride (AlN). In these evaporation boats, $TiB_2$ is the electrically conductive component which allows the evaporator to be heated like an ohmic resistance.

One of the main problems in the operation of web coating units is the initial wetting of the evaporation boats with the metal to be vapor-deposited. In practice, the operator has to have a great deal of experience to be able to carry out the initial wetting of the evaporation boats in an optimal way. Thus, the term "break-in procedure" has become established to describe this initial wetting of the evaporation boat which illustrates the complexity of this step. Thus, during the running up phase, the cavity of the evaporator can be incompletely wetted. This results in increased deposits on the side opposite that where the wire is fed which forces the operator to run the evaporation boat "hot" for a given evaporation rate, i.e. to heat it to a very high temperature. This leads to a drastic decrease in the life of the evaporation boats.

In addition, incomplete wetting corresponds to non-uniform wetting of the cavity of the evaporation boat. As a result, uniform, continuous evaporation of the metal to be evaporated is not possible later. This forces the operator to adjust the evaporator heating continually. As a result, the evaporation boats, on average, run too hot. This result greatly reduces the life of the evaporation boats, as already mentioned.

In the case of evaporation boats having a very high electric resistance, the voltage of the vapor deposition unit is generally insufficient to heat it to the wetting temperature. If such an evaporation boat were to be wetted more readily than conventional evaporation boats, some wetting would take place even before the full wetting temperature reached. As a result, the system evaporation boat-aluminum bath has a lower electric resistance. This immediately produces a higher current which in turn leads to better heating of the evaporation boat and consequently also to even better wetting.

This feature also makes the problem of the difference in the resistance from evaporation boat to evaporation boat significantly less critical and stoppage of the vapor deposition units due to high-resistance evaporation boats does not occur.

The better wetting of the evaporation material by the metal to be evaporated, the lower the risk of the evaporation boat being overheated and thus the life of the evaporation boat being drastically reduced. In addition, good wetting leads to optimum metal bath formation in the cavity of the evaporation boat and thus to improved evaporation conditions and more uniform stressing of the evaporation boat which, in turn, increases the life of the evaporation boat.

SUMMARY OF THE INVENTION

It is an object of the invention to provide an evaporation boat of ceramic material for the evaporation of metal comprising a conductive component and a nonconductive component, wherein the boat is initially wetted more readily by the metal to be evaporated.

The object is achieved by providing an evaporation boat wherein the conductive component of the ceramic material is concentrated at the surface of the evaporation boat at which the evaporation of the metal occurs.

Preferably, the content of the conductive component at the surface of the evaporation boat at which evaporation of the metal occurs is at least two wt % (2%) (relative) higher than in the remaining material of the evaporation boat.

Preferably, a layer of the conductive component of the ceramic material is located on the surface of the evaporation boat at which the evaporation of the metal occurs.

The layer of the conductive component should preferably be in electrical contact with the remaining evaporator boat material. As a result, this layer becomes self-conducting and, owing to the low resistivity of the material, becomes hotter than the remaining evaporator boat material. This again leads to an improvement in the wettability of the surface of the evaporator boat.

The concentration of the conductive component at the surface of the evaporation boat is preferably achieved starting from an evaporation boat known from the prior art by means of one of the three methods described below:

1) The surface of the evaporation boat from which the evaporation of the metal is to take place in normal operation is heated by means of a high-energy beam so that the nonconductive components such as BN with a melting point of 2300° C. and AlN having a melting point of 2300° C. evaporate and at the same time the conductive component such as $TiB_2$ having a melting point of 2900° C. is only melted. The energy content of the high energy beam is therefore preferably selected such that it heats the surface of the evaporation boat to more than 2900° C. but not less than 2700° C. This results, after cooling, in a layer enriched in the conductive ceramic component such as $TiB_2$, on the surface of the of the evaporation boat. More brief heating gives a layer which is less enriched in the conductive ceramic component on the surface of the evaporation boat.

2. Powder comprising the conductive ceramic component can be applied to the surface of the evaporation boat and welded on by means of a high-energy beam to form an electrically conductive layer of the conductive ceramic material. This can be achieved such as through using $TiB_2$ as a conductive ceramic component, and using a method analogous to a $TiB_2$ powder coating process known per se.

3. Powder comprising the conductive ceramic component can be processed with an organic or inorganic binder to form a paste and the paste applied to the surface of the evaporation boat. The binder is selected so that it evaporates during the heating of the evaporation boat.

Thus, when the evaporation boat is heated, the binder evaporates and the desired electrically conductive layer which can subsequently be wetted by aluminum is formed. The binder used can be, for example, glycerol. This layer can be additionally treated by means of a high-energy beam as described in the second process to obtain better contact between the electrically conductive layer and the remaining evaporator material.

DETAILED DESCRIPTION OF THE PREFERRED EMBODIMENT

As a rule, the electrically conductive component of the ceramic material is $TiB_2$. For this reason, $TiB_2$-containing powder is preferably used as a powder comprising the conductive ceramic component.

The high energy beam can be in the form of a laser beam. This laser can be, for example, a gas, solid state, or semiconductor laser.

The heating of the surface of the ceramic evaporation boat by means of a high-energy beam is preferably carried out under inert gas conditions. Examples of inert gases are helium and argon.

The evaporation boats of the present invention have the following advantages over known evaporation boats:

1) From the start of use, these evaporation boats have good uniform wetting which leads to a constant and uniform (in space) evaporation rate without scattering.
2) They run in a steady manner from the beginning and power does not have to be continually adjusted.
3) the scattering in the resistance of the evaporation boats which results from the scarcely avoidable scatter in the resistance of the sintered body from which the evaporation boats are produced does not have the adverse effect of the higher resistance evaporation boats no longer being wettable and the vapor deposition units therefore have to be stopped.

The following examples illustrate the invention.

EXAMPLE 1

Production of an Evaporation Boat According to the Invention

The surface from which metal evaporation is to take place on an evaporation boat having the dimensions 10×20×120 mm and produced from a ceramic material consisting of 47.5% by weight of $TiB_2$ and 52.5.% by weight of BN, was irradiated by a YAG laser (wavelength=1.06 μm/beam diameter=6 mm/power=100 W) in a plurality of traces (80 mm long) in a stream of argon.

EXAMPLE 2

Production of an Evaporation Boat According to the Invention

Grooves having a depth of about 0.5 mm were scratched mechanically into the surface of an evaporation boat from which metal evaporation is to take place wherein the boat has the dimensions of 10×20×120 mm and 47.5% by weight of $TiB_2$ and 52.5% by weight of BN. $TiB_2$ powder was sprinkled on to these grooves. This powder was irradiated by means of a YAG laser as described in Example 1. Unbound powder residues were subsequently blown off using compressed air.

EXAMPLE 3

Production of an Evaporation Boat According to the Invention

A paste of $TiB_2$ powder and glycerol as binder was applied by means of a spatula to the surface of an evaporation boat from which evaporation is to take place. The boat has the dimensions of 10×20×120 mm and 47.5% by weight of $TiB_2$ and 52.5% by weight of Bn.

EXAMPLE 4

Comparison of the Evaporation Boats of the Invention with a Known Evaporation Boat As a comparison evaporation boat, an additional evaporation boat having the same dimensions as described above was produced from the same batch of sintered material with 47.5% by weight of $TiB_2$ and 52.5% by weight of BN from which the evaporation boats described in Examples 1 to 3 had been produced.

This comparison evaporation boat and the evaporation boats of the invention produced in Examples 1 to 3 were compared under defined conditions.

The evaporators were clamped in place at the end faces and, before heating, 2 g of Al wire was laid on the middle of the surface of the evaporation boat from which metal evaporation is to occur. A vacuum of $<1\times10^{-4}$ mbar was applied. In this high vacuum, the evaporation boats were heated linearly over a period of 10 minutes to a power of 3.96 KW by means of a power ramping software program.

The evaporator voltage was measured directly at the end faces of the evaporators. At the same time, the current flowing through the evaporation boat was measured at a different point in the circuit. The measured values for voltage and the current were recorded at one second intervals. They were available as data file after the experiment.

The wetting of the evaporator surface by the aluminum was generally indicated by a disproportionate increase in the current at a given voltage compared to the increase in current through an evaporator without aluminum placed on it, since the wetting aluminum makes possible an additional flow of current compared to an evaporator without aluminum.

If the heating power at which this increase in current takes place is calculated for the glowing surface, a wetting power per unit area of glowing surface of 44 W/cm$^2$ is obtained for the comparison evaporation boat while that for the evaporation boats from Examples 1 to 3 is <40 W/cm$^2$. Ultimately, these processes can form an evaporation boat that has an electrically conductive component on the surface of the evaporation boat that has a resistivity at room temperature of between 100 and 1500 μΩcm and a resistivity at operating temperature of between 300 and 4500 μΩcm.

This result demonstrates that the evaporation boats of the invention were wetted at lower temperatures than the comparison evaporation boat and thus have a better initial wetting performance than known evaporators.

Accordingly, while several embodiments of the present invention have been shown and described, it is to be understood that many changes and modifications may be made thereunto without departing from the spirit and scope of the invention as defined in the appended claims.

What is claimed is:

1. A process for producing an evaporation boat of ceramic material having a surface for evaporating metal consisting essentially of the following steps:

providing an initial evaporation boat having an electrically conductive ceramic component and at least one electrically non-conductive ceramic component on the surface of said initial evaporation boat; and directing a laser beam on the surface of said initial evaporation boat to simultaneously evaporate said at least one electrically non-conductive ceramic component from the surface of said initial evaporation boat and melt said electrically conductive ceramic component on the surface of said initial evaporation boat to form a modified evaporation boat having a layer of said electrically conductive ceramic component that has a resistivity at room temperature of between 100 and 1500 $\mu\Omega$cm and a resistivity at operating temperature of between 300 and 4500 $\mu\Omega$cm.

2. The process as in claim 1, wherein said electrically conductive ceramic component comprises $TiB_2$.

3. The process as in claim 1, wherein said step of providing an initial evaporation boat includes the step of applying a paste to the surface of said initial evaporation boat, said paste comprising the same material as said electrically conductive ceramic component in the initial evaporation boat and at least one binder selected from the group consisting of organic binders, and inorganic binders wherein said binders vaporize during the step of directing said laser beam on said initial evaporation boat.

4. The process as in claim 3, wherein the binder used is glycerol.

5. The method as in claim 1, wherein said step of providing an initial evaporation boat includes providing an initial evaporation boat comprising said electrically conductive ceramic component and said at least one electrically non-conductive ceramic component.

6. The process as in claim 1 wherein said step of directing said laser beam on said surface of the initial evaporation boat is performed to create a layer on the surface that is enriched in electrically conductive ceramic component relative to said electrically non-conductive ceramic component.

7. The process as in claim 1, wherein said step of directing said laser beam includes directing said laser beam on only a portion of the surface of said initial evaporation boat so that only a portion of said at least one electrically non-conductive ceramic component is evaporated while only a portion of said electrically conductive ceramic component is melted to form an electrically conductive layer on only a portion of the surface of said initial evaporation boat.

8. A process for producing an evaporation boat of ceramic material having a surface for evaporation metal consisting essentially of the following steps:

providing an initial evaporation boat having an electrically conductive ceramic component and at least one on electrically non-conductive ceramic component on the surface of said initial evaporation boat;

providing an additional amount of electrically conductive ceramic component to the surface of said initial evaporation boat; and directing a laser beam on the surface of said initial evaporation boat to simultaneously evaporate said at least one electrically non-conductive ceramic component from the surface of said initial evaporation boat and melt said electrically conductive ceramic component on the surface of said initial evaporation boat to form a modified evaporation boat having a layer of said electrically conductive ceramic component that has a resistivity at room temperature of between 100 and 1500 $\mu\Omega$cm and a resistivity at operating temperature of between 300 and 4500 $\mu\Omega$cm.

9. The process as in claim 8, wherein said step of providing an additional amount of electrically conductive ceramic component includes the step of applying a powder comprising the electrically conductive ceramic component of said initial evaporation boat to the surface of said initial evaporation boat.

10. The process as in claim 9, wherein said step of directing said laser beam comprises welding said powder to said surface via said laser beam so as to form an electrically conductive layer from said electrically conductive ceramic component on the surface.

11. The process as in claim 10, wherein said welding step using said laser beam includes using YAG a laser beam.

12. The process as in claim 8, wherein said step of directing said laser beam results in said modified evaporation boat having a surface composition with said electrically conductive ceramic component being at least 2 wt % higher relative to any remaining material on the surface of said modified evaporation boat.

13. The process as in claim 8, wherein said step of providing said additional amount of electrically conductive ceramic component comprises providing a concentrated layer of said electrically conductive ceramic component on the surface of said initial evaporation boat.

14. A process for producing an evaporation boat of ceramic material having a surface for evaporating metal consisting essentially of the following steps:

providing an initial evaporation boat having an electrically conductive ceramic component and at least one electrically non-conductive ceramic component on the surface of said initial evaporation boat; and directing a laser beam on the surface of said initial evaporation boat to simultaneously evaporate said at least one electrically non-conductive ceramic component from the surface of said initial evaporation boat and melt said electrically conductive ceramic component on the surface of said initial evaporation boat to form a modified evaporation boat.

15. The method as in claim 14, wherein said step of providing an initial evaporation boat includes providing an initial evaporation boat comprising said electrically conductive ceramic component and said at least one electrically non-conductive ceramic component.

16. The process as in claim 14, wherein said step of directing said laser beam on said surface of the initial evaporation boat is performed to create a layer on the surface that is enriched in electrically conductive ceramic component relative to said electrically non-conductive ceramic component.

17. The process as in claim 14, wherein said step of directing said laser beam includes directing said laser beam on only a portion of the surface of said initial evaporation boat so that only a portion of said at least one electrically non-conductive ceramic component is evaporated while only a portion of said electrically conductive ceramic component is melted to form an electrically conductive layer on only a portion of the surface of said initial evaporation boat.

18. A process for producing an evaporation boat of ceramic material having a surface for evaporating metal consisting essentially of the following steps:

providing an initial evaporation boat having an electrically conductive ceramic component and at least one electrically non-conductive ceramic component; and directing a laser beam on a potion of the surface of said initial evaporation boat to simultaneously evaporate a portion of said at least one electrically non-conductive ceramic component from the surface of said initial evaporation boat and melt a portion of said electrically conductive ceramic component on the surface of said initial evaporation boat to form a layer on at least a portion of the surface that is enriched in electrically conductive ceramic component to form a modified evaporation boat so that said enriched layer of electrically conductive ceramic component has a resistivity at room temperature of between 100 and 1500 $\mu\Omega$cm and a resistivity at operating temperature of between 300 and 4500 $\mu\Omega$cm.

* * * * *